United States Patent
Morton et al.

(10) Patent No.: US 10,855,376 B1
(45) Date of Patent: Dec. 1, 2020

(54) REFLECTION ENGINEERING / WAVELENGTH DIVISION MULTIPLEXING (WDM) GEOMETRIC OPTICAL ISOLATOR

(71) Applicant: Morton Photonics, West Friendship, MD (US)

(72) Inventors: Paul A. Morton, West Friendship, MD (US); Jacob Khurgin, Pikesville, MD (US)

(73) Assignee: Morton Photonics, West Friendship, MD (US)

( * ) Notice: Subject to any disclaimer, the term of this patent is extended or adjusted under 35 U.S.C. 154(b) by 0 days.

(21) Appl. No.: 16/777,131

(22) Filed: Jan. 30, 2020

Related U.S. Application Data (62) Division of application No. 16/393,842, filed on Apr. 24, 2019, now Pat. No. 10,727,947.

(60) Provisional application No. 62/662,537, filed on Apr. 25, 2018.

(51) Int. Cl.
| | | |
|---|---|---|
| G02B 27/00 | (2006.01) |
| H01Q 3/26 | (2006.01) |
| H04B 10/50 | (2013.01) |
| H04Q 11/00 | (2006.01) |
| H04B 10/40 | (2013.01) |
| H04B 10/2575 | (2013.01) |
| H04Q 5/00 | (2006.01) |
| H04B 10/516 | (2013.01) |

(52) U.S. Cl.
CPC ............. *H04B 10/40* (2013.01); *G02B 27/00* (2013.01); *H01Q 3/2676* (2013.01); *H04B 10/25759* (2013.01); *H04B 10/50* (2013.01); *H04B 10/516* (2013.01); *H04B 2210/006* (2013.01); *H04Q 5/00* (2013.01); *H04Q 11/00* (2013.01)

(58) Field of Classification Search
None
See application file for complete search history.

(56) References Cited

U.S. PATENT DOCUMENTS

| | | | | |
|---|---|---|---|---|
| 6,917,636 | B2* | 7/2005 | Blauvelt | H01S 5/026 372/102 |
| 2003/0035449 | A1* | 2/2003 | Tomlinson | H01S 5/141 372/29.02 |
| 2003/0095737 | A1* | 5/2003 | Welch | G02B 6/12021 385/14 |
| 2009/0092354 | A1* | 4/2009 | Joyner | G02B 6/12004 385/14 |
| 2011/0235970 | A1* | 9/2011 | Flora | G01M 11/3154 385/28 |

* cited by examiner

*Primary Examiner* — Darren E Wolf
(74) *Attorney, Agent, or Firm* — Nadya Reingand; Yan Hunkin (57) ABSTRACT

The present invention reduces the level of optical reflections created in a photonic integrated circuit (PIC) going back into an integrated laser through Reflection Engineering; optimizing the phase/timing and position of optical reflections inherent to a PIC design while adding engineered reflections to the PIC to allow inherent reflections to be reduced or eliminated. The Wavelength Division Multiplexed (WDM) geometric optical isolator of the present invention combines an array of closely spaced WDM lasers with an array of modulators in a novel geometry in order to provide effective optical isolation of the lasers.

15 Claims, 9 Drawing Sheets

REFLECTION ENGINEERING / WAVELENGTH DIVISION MULTIPLEXING (WDM) GEOMETRIC OPTICAL ISOLATOR

CROSS-REFERENCE TO RELATED APPLICATIONS

This patent application is a divisional application of the U.S. application Ser. No. 16/393,842, filed on Apr. 24, 2019 which claims priority to the U.S. Provisional Patent Application Ser. No. 62/622,537, titled "Transmitter including WDM Geometric Optical Isolator", filed on Apr. 25, 2018, all of which are fully incorporated herein by reference.

STATEMENT REGARDING FEDERAL SPONSORED RESEARCH AND DEVELOPMENT

This invention was made with U.S. Government support under Contracts FA8650-16-C-1758 and FA8650-17-P-1114, Air Force SBIR Projects. The U.S. Government has certain rights in the invention.

FIELD OF INVENTION

This invention relates to high performance integrated lasers, and to radio frequency (RF) photonics systems and analog photonic links, enabled by photonic integrated circuit (PIC) devices.

BACKGROUND

Figure 1:
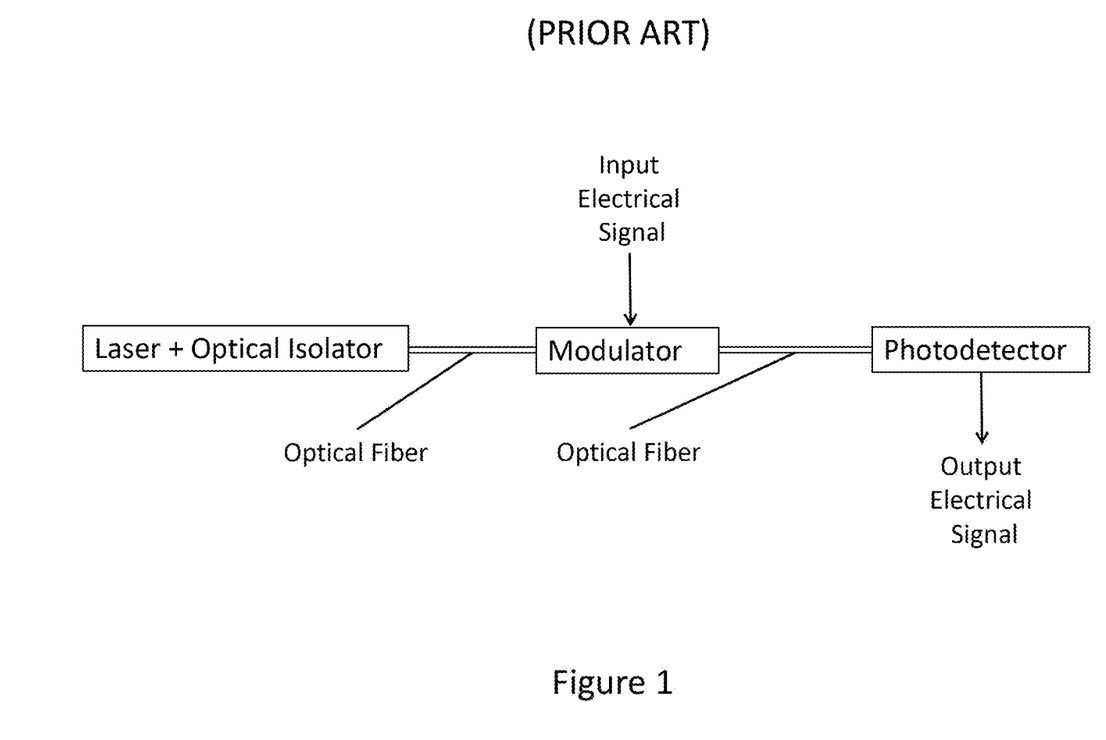
FIG. 1 shows a prior art schematic of a discrete component-based RF Photonic link (PRIOR ART).

High-performance radio frequency (RF) photonic links, e.g., high dynamic range analog photonic links, are key to the operation of many RF systems. Historically, these analog photonic links, which operate with a high spurious free dynamic range (SFDR), are built from three major components, typically separated by optical fibers; a laser, a modulator, and a photodetector. In a high-SFDR system, the laser provides high optical power with very low noise, in particular the laser RIN. The laser is typically packaged in its own hermetically sealed module that includes a discrete optical isolator between the laser and its output fiber, which significantly reduces the level of any optical reflections back into the laser; this is required because lasers are very sensitive to optical reflections, and their noise level, both RIN and linewidth (where linewidth refers to both the low frequency phase noise and the Lorentzian linewidth of the laser), are significantly increased if optical reflections return back into the laser. A schematic of a Prior Art RF photonic link made from such discrete components is shown in FIG. 1.

The laser provides a single frequency optical carrier signal, which is fed into the modulator through an optical fiber. An electrical input signal drives the modulator to provide a modulated optical signal at the modulator optical output; e.g. for intensity modulation using a Mach-Zehnder interferometer (MZI) based modulator, this will be a standard double sideband signal, including a carrier plus two sidebands. Other modulator types and modulation formats provide similar modulated spectra, a carrier (or suppressed carrier) plus one or more sidebands. The output of the modulator is fed into an optical fiber, which is used to connect the transmitter side of the system to the receiver side of the system—this may be close, within a single unit, or between units, or may be longer distances up to multiple kilometers. For long distances, such as 10's of km or more, additional optical amplification and filtering may be included. At the receiver side of the system, the fiber is coupled into a photodetector, which converts the optical signal into an output electrical signal.

In some cases both outputs of an MZI modulator are passed along a pair of optical fibers, and the two fiber outputs are detected using a pair of balanced photodetectors, to improve the system performance.

In some cases there is no optical fiber used to connect the transmitter and receiver, and the optical transmission is carried out within some other medium, such as a free space by using lensing to aim the transmitted light beam and receive that light beam, or by other waveguides or ways of routing the transmitted light to the receiver.

The operation of a high-SFDR analog optical link, e.g., SFDR≥110 dB.Hz$^{2/3}$, is strongly dependent on the power level and the RIN of the source laser, which itself depends on having a high performance and broadband optical isolator to significantly reduce the level of any optical reflections returning to the laser. Discrete optical isolators, providing high isolation (>30 dB), low loss (<1 dB), and broad bandwidth (>30 nm), i.e., enough bandwidth to support lasers operating at a range of wavelengths that are modulated at high speed, are widely available to be used within laser modules. With sufficient optical isolation provided by the isolator, e.g., 30 dB, the increase in intrinsic RIN or linewidth of the laser is negligible for any small optical reflections returning to the laser module. The system itself is also designed to provide only very small reflections back from any point to the laser source.

Such systems require a high performance RF photonic transmitter, that includes a laser source and modulator. The laser operation is very sensitive to optical reflections from within the transmitter PIC or in the following optical system, which can increase the intrinsic laser relative intensity noise (RIN) and laser phase noise/linewidth, reducing system performance. This invention includes multiple approaches to reduce the level of optical reflections back to a source laser.

SUMMARY

This invention describes multiple ways to reduce the size of optical reflections within a transmitter PIC that return to a laser. Reflection Engineering is a device design concept in which unavoidable reflections are controlled (amplitude and phase) and optimized to reduce the amplitude of the overall reflection back to the laser. Reflection Engineering includes the idea of including Engineered Reflections (ER) into the PIC in order to minimize the reflection to the laser. The invention also includes the reduction of reflections to lasers through a novel transmitter geometry incorporating multiple WDM lasers and modulators, providing an effective WDM Geometric Optical Isolator.

In this invention, the first concept reduces optical reflections that increase the noise of a semiconductor laser—either reflections within the laser structure, or reflections external to the laser structure within the same PIC. Reflections are reduced or eliminated through 'Reflection Engineering', in which the multiple reflections within a PIC are identified, including their amplitude and phase, and then these reflections, potentially one or more Engineered Reflections (ERs), are optimized so that the overall reflection in the laser is reduced or eliminated. The laser is a single frequency device, and so all reflections at that frequency add up to provide a single reflection at the lasing wavelength with a single amplitude and phase. For this calculated Initial Reflection amplitude and phase, an additional Engineered Reflection can be added to the PIC that is the same amplitude but with a phase shift of 180° relative to the Initial Reflection, such that when these are added together, they destructively interfere and reduce or eliminate the Initial Reflection.

Within an optical transmitter of a laser followed by an MZI modulator, the Reflection Engineering approach can reduce the optical reflections from within an MZI modulator, or a more complex transmitter design with multiple MZI modulators, back to the laser source. The reflection elements (e.g. often from transitions/changes in waveguide geometry) within the two phase modulator arms of an MZI are often symmetrical; however, by controlling the positions of the phase modulator sub-components on the two arms, it is possible to align their reflections to mostly destructively interfere with each other (i.e., have similar amplitude and be about 180° out of phase with each other) when they recombine in the input coupler before going back to the laser. This Reflection Engineering concept is used to design the amplitude and phase or timing of optical reflections relative to each other, either within an MZI modulator, within another type of modulator, or within any photonic component within a PIC, in order to reduce the overall size of optical reflections back to a laser on that PIC. The size/amplitude of the optical reflections can be designed to optimize destructive interference and therefore minimize the size of reflections back to a laser, and additionally, controlled reflections can be added to a PIC in order to reduce or eliminate a known reflection, e.g., a reflection from the phase control section of an MZI modulator. Additional waveguides and structures can be added to a PIC design in order to introduce controlled reflections that will destructively interfere with known reflections of the initial PIC structure. This concept takes advantage of the fact that within a single PIC device, the optical phase can be very well controlled between all elements or parts of that device.

DETAILED DESCRIPTION OF THE PREFERRED EMBODIMENTS

As noted in the Background section, there is a very strong interest to develop low-cost, and small size, high-SFDR analog photonic links, using photonic integration to meet these goals. The Silicon Photonics platform utilizes CMOS manufacturing facilities and processes to provide high-volume and low-cost silicon photonics devices, and the possibility of fabricating high-performance analog photonic transmitters using this technology is very appealing. A Silicon Photonics platform including heterogeneous integration of III-V semiconductors and other materials allows for high-performance lasers and linear MZI modulators to be fabricated, either as separate components or as a combined transmitter PIC.

However, in order for a PIC based high-SFDR analog photonic link to be developed, an integrated optical isolator device is required between the laser and the modulator in the transmitter PIC, to provide some level of optical isolation from the laser to the rest of the PIC and the following system. This integrated isolator, with performance approaching that of discrete optical isolators, is not available, and is not likely to become available for many years, due primarily to the poor performance of thin film magneto-optic (MO) materials available for PIC platforms, that would be used in an integrated isolator. In the absence of an integrated optical isolator, one or more approaches must be used to provide a reduction of optical reflections back to the laser;

i) The laser must be designed to be less sensitive to optical reflections;

ii) The optical reflections themselves should be made very small;

iii) A new scheme should be introduced to reduce the level of reflections.

A high performance (i.e. high SFDR) RF photonic link requires a high-power laser source, and thus sometimes a semiconductor laser is amplified in an erbium doped fiber amplifier (EDFA) in order to increase the power level to that required to meet link performance requirements. A high power, low RIN laser source increases the system SFDR, lowers the noise figure (NF) and increases the system Gain. While individual semiconductor lasers may not provide enough power to support a very high SFDR link, by taking advantage of photonic integration, especially a high volume, low cost CMOS based platform such as Silicon Photonics, arrays of semiconductor lasers can be utilized to provide the necessary combined high power level; these arrays of lasers are an inherent part of the WDM Geometric Optical Isolator concept.

Figure 2:
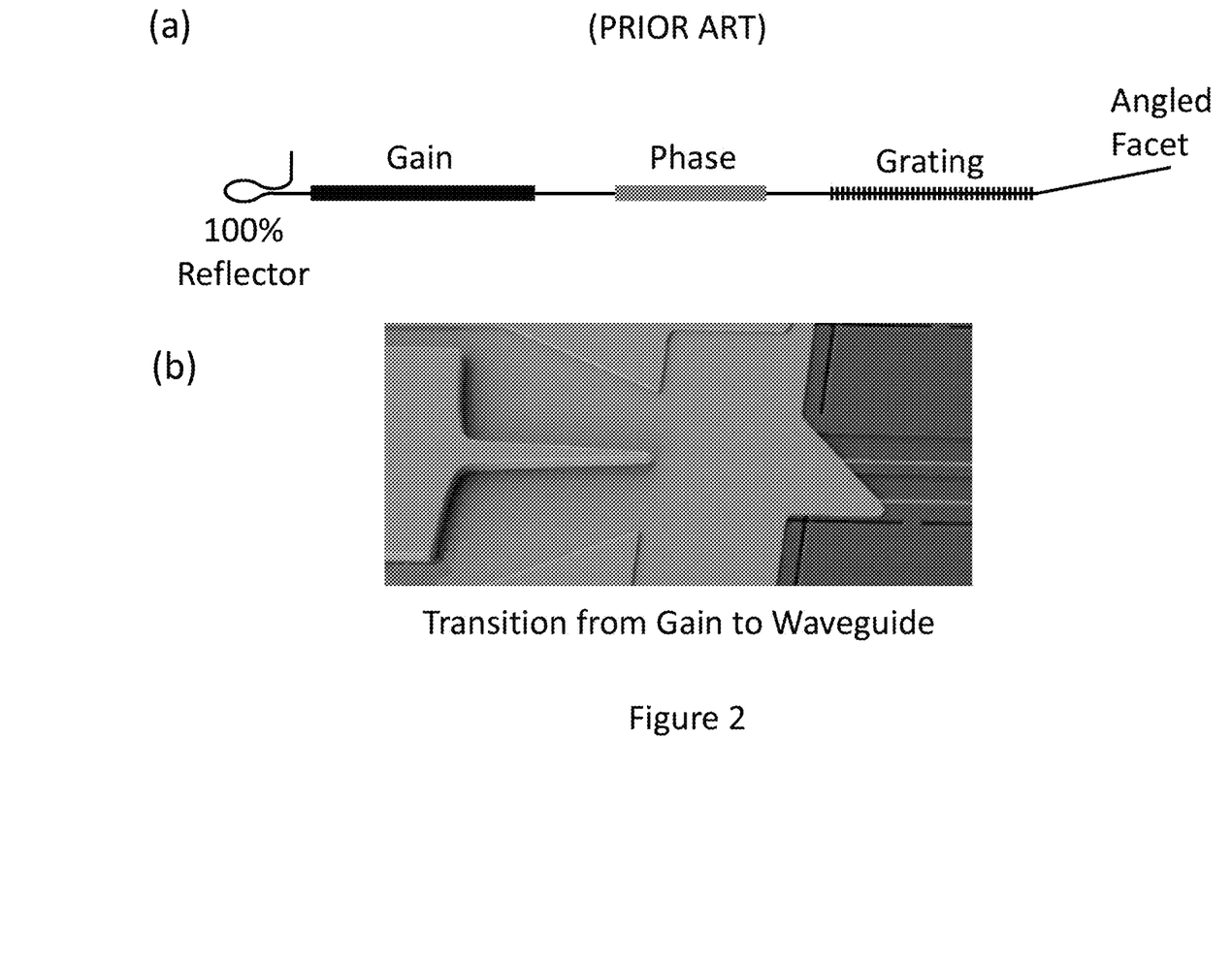
FIG. 2 shows (a) a prior art schematic of an integrated distributed Bragg reflector (DBR) laser, including a 100% reflector at one end of the laser, followed by a gain section, a phase control section, and the Bragg grating, all interconnected by the same optical waveguide, with the output optical waveguide passing through the Bragg grating and being angled (to reduce optical reflections) at the output facet, and (b) an SEM of the transition from the gain section to the waveguide section, providing an example of where optical reflections occur within a PIC device (PRIOR ART).
Figure 3:
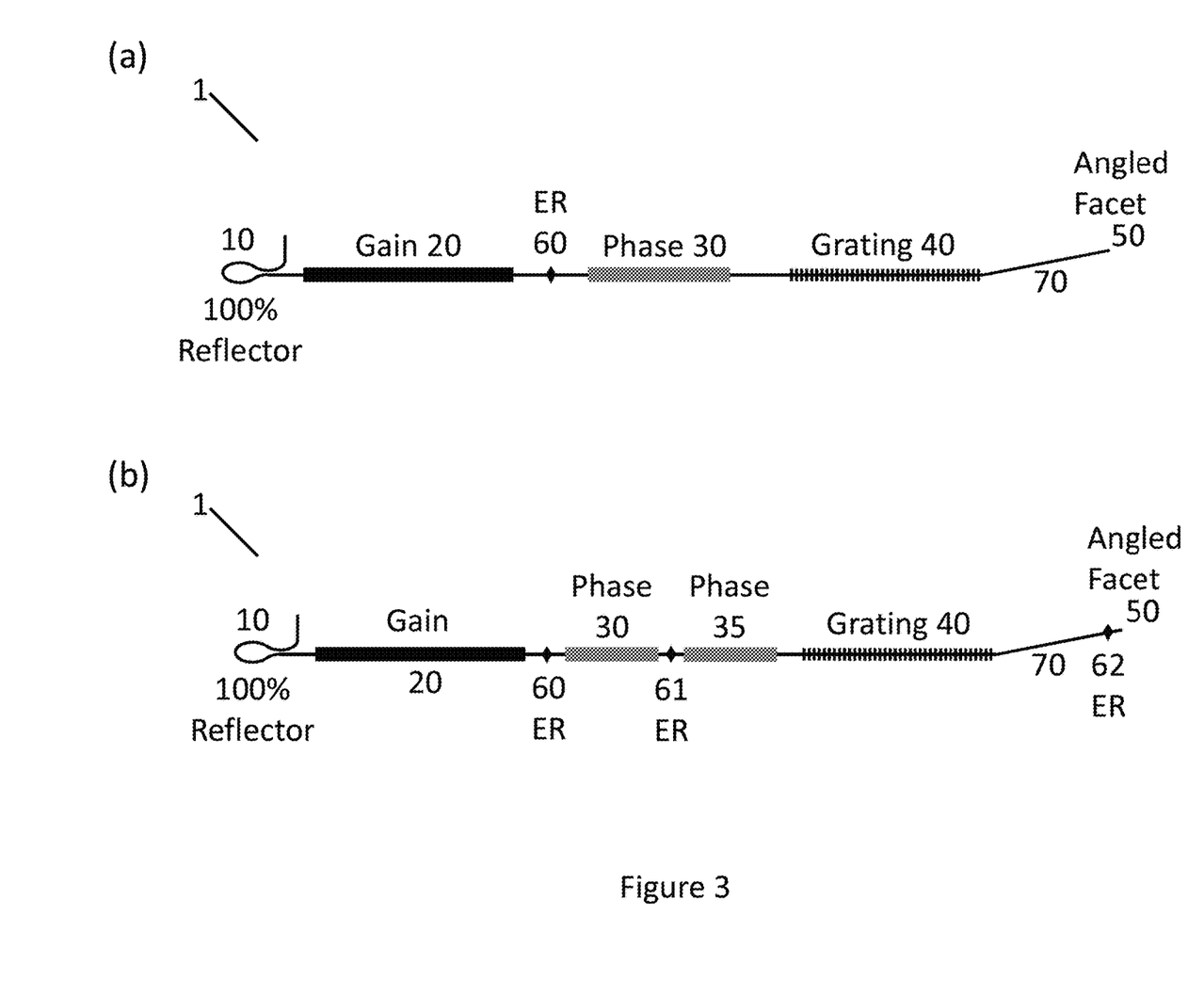
FIG. 3 shows (a) the integrated distributed Bragg reflector laser (from FIG. 2) with an added Engineered Reflection (ER) 60, optimized to reduce/eliminate reflections back to the gain section of the laser; (b) the integrated distributed Bragg reflector laser (from FIG. 2) with an added Engineered Reflection (ER) 60, optimized to reduce/eliminate reflections back to the gain section of the laser, plus an ER 61 placed between 2 phase control sections so that the optical phase of ER 61 can be tuned to eliminate another reflection, plus an ER 62 placed close to the phase controlled angled facets (e.g. an etched facet) to reduce/eliminate the facet reflection.

FIG. 3 shows 2 versions of an integrated distributed Bragg Reflector (DBR) laser (compare to the PRIOR ART version shown in FIG. 2), with added Engineered Reflections (ERs) in order to reduce/eliminate reflections within the DBR laser into the Gain section. The DBR laser 1 incorporates a 100% reflector at one end of the laser cavity, created by a waveguide-based loop reflector 10, connected to a Gain section 20, a Phase Control section 30, a Bragg grating section 40, and then angled output section 50 by a continuous optical waveguide 70. In FIG. 3(a), ER 60 provides a single optimized reflection to reduce/eliminate any inherent optical reflections from within the DBR device, such as from transitions from the waveguide 70 into more complex sections such as the gain section 20 (an SEM of such a transition is shown in FIG. 2b). FIG. 3(b) shows different options for ERs that could be included in the DBR laser, including the same ER 60, but also a phase tunable ER 61 that is placed between 2 phase control sections so that during operation this reflection can be optimized by tuning its phase relative to other reflections in the DBR. Additionally, FIG. 3(b) includes an ER 62 close to the output angled facet of the device where this ER 62 can eliminate a reflection from that angled facet.

Figure 4:
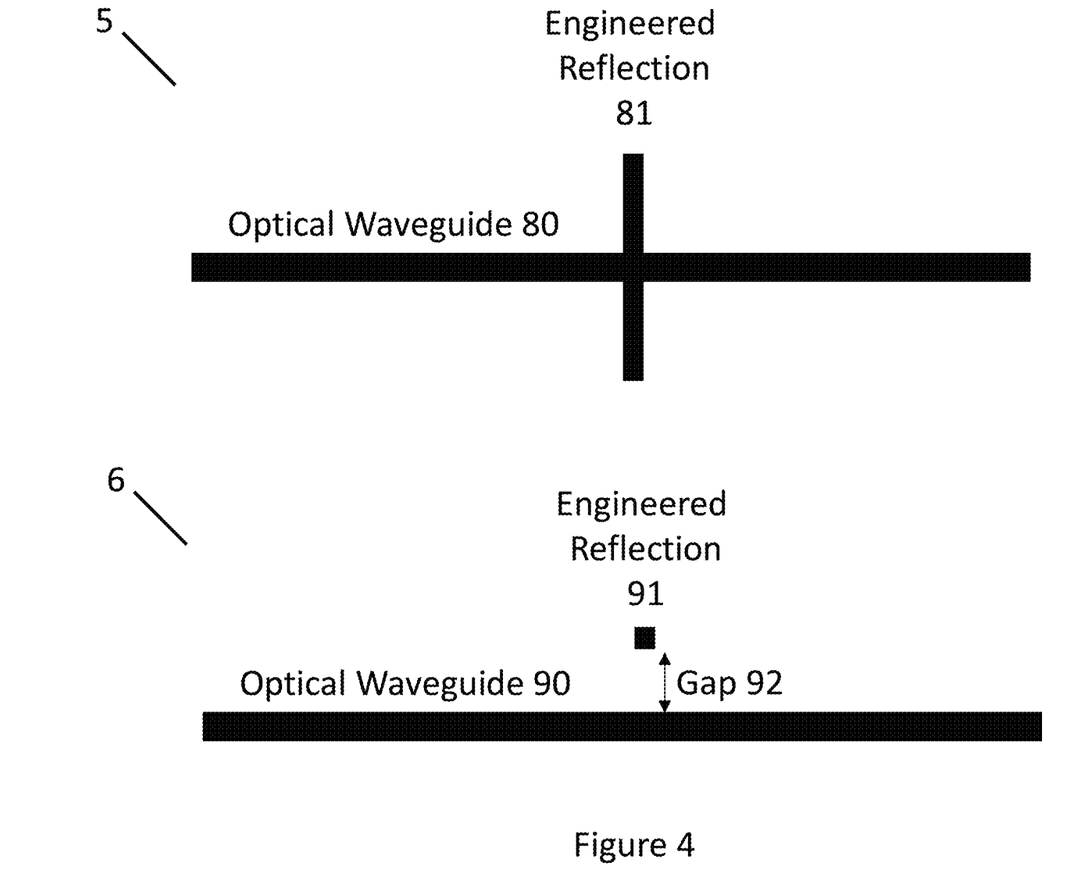
FIG. 4 shows two examples of Engineered Reflections (ERs), shown as controlled perturbations around an optical waveguide.

FIG. 4 shows two examples of potential Engineered Reflections (ERs). In the first example 5, light traveling along optical waveguide 80 is reflected off perturbation 81, which provides a fixed reflection amplitude and phase (from the small thickness of the perturbation, being far less than an optical wavelength in the material). In the second example 6, light traveling along optical waveguide 90 is reflected off perturbation 91, which provides a fixed reflection amplitude and phase. This design can provide a smaller reflection, from the much smaller perturbation of a single rectangular or other shaped perturbation (again, the dimensions being far less than an optical wavelength in the material), the size of the perturbation being controlled by Gap 92 between the waveguide and the perturbation. The larger ER can be achieved by including multiple perturbations separated by the laser wavelength divided by 2, e.g., a short Bragg grating.

Figure 5:
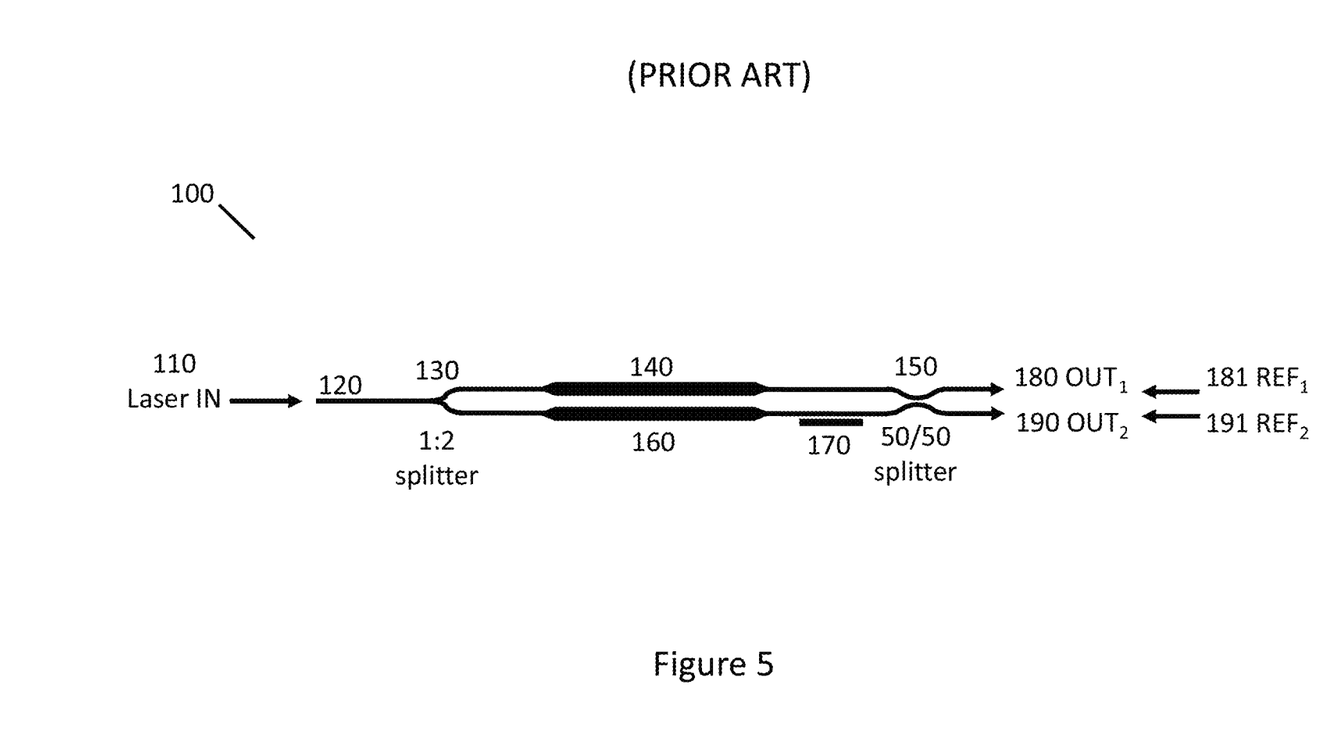
FIG. 5 shows a prior art schematic of an MZI based modulator device with a single input and two outputs (PRIOR ART).

FIG. 5 shows an embodiment of a prior art MZI based modulator device 100. The MZI modulator 100 has an input waveguide 120 into which single frequency light from a laser 110 is input, this light being split into two waveguides with equal proportion of light passing into those two waveguides, i.e. a 50/50 splitter, 130. In the upper arm of the MZI modulator the laser light passes through a phase modulator 140 and then on to a 2×2 combiner/splitter (often a 2×2 directional coupler) 150. In the lower arm of the MZI modulator the light passes through a phase modulator 160, then through a phase control element 170, and then on to the 2×2 combiner/splitter 150. The phase modulators 140 and 160 are driven in a push-pull arrangement, providing opposite signs of phase modulation at the same time, so that when the optical signals passing through the upper and lower arms are combined in 150, they provide two outputs 180 and 190, which are modulated versions of the single frequency light from the laser. The phase modulators may be an electro-optic material such as Lithium Niobate, where the phase modulation is achieved by applying an electric field across the Lithium Niobate waveguide, or a III-V material such as indium phosphide (InP) based multiple quantum well (MQW) material. The phase control element 170 is used to bias the operation of the MZI modulator, such as adding 90° of optical phase to the lower arm to place the MZI modulator at Quadrature Bias, i.e., the output at half of the maximum power, or such as adding 180° of optical phase to the lower arm to place the MZI modulator at Null Bias, i.e., the output at minimum power (or zero output in a perfect device).

FIG. 5 shows optical reflections (or sets of multiple optical reflections) 181 and 191, which occur from reflections of the two optical outputs 180 and 190, being reflected back from the output facets of the PIC device, and from points further on in the optical system. Such additional reflection points can include coupling elements in the output of the device, optical connectors in an optical cable, reflections from a photodetector at the end of the optical system, or reflections from any transitions throughout this optical system. The main optical reflections within a PIC device are typically from the output facet, and care is taken to minimize these facet reflections, e.g., by angling the optical waveguide at the facet and/or anti-reflection coating the facet. It is possible to include a discrete optical isolator following the output facet of the PIC; in that case reflections 181 and 191 would be just from the output facet of the PIC. Optical reflections 181 and 191 will pass back through the MZI modulator 100 and back to the laser 110. Optical reflections back into a laser are problematic, depending on their size, as they can increase the noise of the laser, e.g., increase the laser RIN, broaden the laser linewidth, or change the wavelength of the laser. In most standard RF photonic transmitter systems, which are made of discrete lasers, modulators, and detectors, interconnected with optical fibers, as exemplified in FIG. 1, an optical isolator is placed between the laser and the MZI modulator to reduce the level of optical reflections from the optical system back into the laser.

Figure 6:
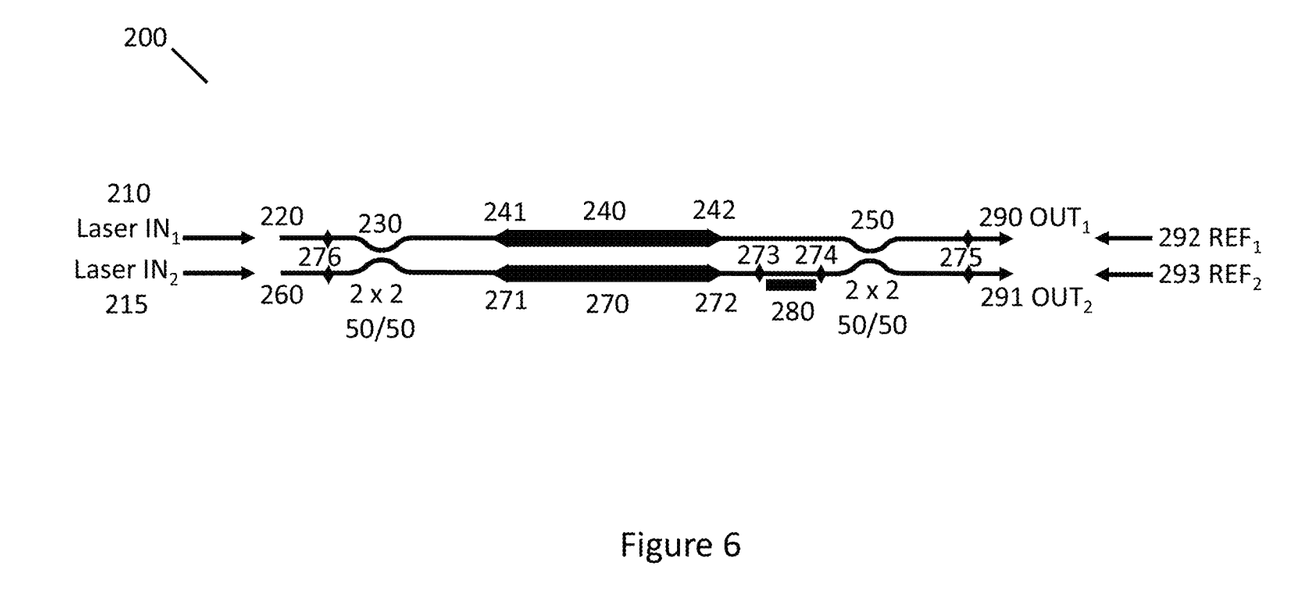
FIG. 6 shows a schematic of an MZI based modulator device with two inputs and two outputs, and showing transitions from passive sections to active sections where optical reflections can occur. The schematic includes two ERs 273 and 274 used to reduce/eliminate time varying reflections from the input and output of phase control section 280, plus ERs 276 to reduce/eliminate non-time varying reflections to the lasers, plus ERs 275 placed close to the output facet in order to counteract the time varying reflections from the output facet (small reflections from angled waveguides).

FIG. 6 shows an example of an optical MZI modulator 200 as described in this invention. The input splitter 230 is optionally a 2×2 (50/50) combiner/splitter, providing two potential inputs to the MZI modulator. The optical modulator can be made of any electro-optic material, or waveguide material, with waveguides making up the MZI structure of the modulator, and modified waveguides making up the phase modulation sections 240 and 270. Input laser light can be from laser 210, or from laser 215. Light from laser 210 passes into waveguide 220, is split in 230 providing 50% of the optical power to each of the upper and lower arms of the MZI. Alternatively, light from laser 215 passes into waveguide 260, is split in 230 providing 50% of the optical power to each of the upper and lower arms of the MZI. Light in the upper arm of the MZI passes through the phase modulator 240, however, optical reflections can occur at the transition to the phase modulation section 241, and at the end of the phase modulation section 242, these optical reflections then passing back to the laser. Similarly light in the lower arm of the MZI passes through the phase modulator 270, however, optical reflections can occur at the transition to the phase modulation section 271, and at the end of the phase modulation section 272, these optical reflections then pass back to the laser. Additionally, light in the lower arm of the MZI passes through the phase control section 280, which may itself provide optical reflections back to the laser, from transitions at the start and at the end of the phase control section 280. Light from the upper and lower sections of the MZI is combined in the output combiner/splitter 250, providing 2 outputs 290 and 291.

In this invention, the laser providing the input to the MZI modulator 200, is integrated onto the same PIC as the modulator, to form a transmitter PIC, however, there is currently no way to include a high performance integrated optical isolator (high isolation, low loss) between the laser and the modulator. As such, optical reflections from reflecting points such as 241, 271, 242, 272, 280, 292 and 293 return to the laser with the potential to disrupt its operation and increase its noise.

It is noted that in a PIC, the laser and modulator are integrated on the same semiconductor substrate, through optical waveguides that are also used to create the laser and the modulator. Due to the small size and rigid structure of all of these waveguides on a PIC, it is possible to have extremely good phase control of the optical signals traveling around the PIC, e.g., from laser to modulator.

In an initial part of this invention, the inevitable optical reflections from the reflecting points, that cannot be avoided, e.g. 241, 271, 242, 272, 280, 292 and 293, or others that may occur within the PIC, are specifically designed so as to minimize the eventual level of optical reflections returning to the laser. As one example, reflections from 241 and 271 are likely to be the same amplitude, created by identical transitions within the waveguides of the device. Due to the high degree of phase control within the device it is possible to design the position of optical reflections 241 and 271 so that their reflections combine destructively when passing through the combiner/splitter 230, therefore significantly reducing the level of a combined reflection passing back into the laser (perfect destructive interference, and elimination of these two reflections, can be achieved if the two reflections have the same magnitude, and if the phase of one is designed to be exactly 180° out of phase with that of the other reflection after passing back through the combiner/splitter 230). Additional detailed control of the position of each potential optical reflection within the PIC can be carried out as part of the device design, so that for a specific laser wavelength, or range of laser wavelengths input to the device, the optical reflections occurring within the PIC and reflecting back to the laser are minimized. In some cases this can include adding small reflections to counteract reflections already present in the PIC device, such as adding engineered reflections 276 to counteract reflections from the start of the phase modulation sections 241 and 271; this 'Reflection Optimization' is also a key element in the design of complex and high-performance PIC devices.

Care should be taken when considering reflections after the two phase modulation sections 240 and 270, as these phase modulation sections provide modulations of the optical phase (changes versus time) of all following reflections, and so perfect destructive interference will be more difficult for reflections occurring after the phase modulation sections. However, the actual phase modulation used in an RF photonic transmitter is typically quite small, and so the principal of controlling the detailed positioning of optical reflections in the PIC after the phase modulation sections to reduce overall reflections will still work, however, depending on the positions of the engineered reflections, not quite as effectively (a lower level of reduction of the amplitude of reflections to the laser) as from reflections before the phase modulation sections.

Additionally, FIG. 6 includes a series of ERs. Two of these ERs, 273 and 274, can be added to provide optical reflections within the PIC that destructively interfere with the time varying optical reflections from the phase control section 280, reducing/eliminating the size of those reflections going back into the laser.

FIG. 6 shows optical reflections (or sets of multiple optical reflections) 292 and 293, which occur from reflections of the two optical outputs 290 and 291, being reflected back from the output facets of the PIC device, and from points further on in the optical system. Reflections from the 2 output facets can be reduced/eliminated by the inclusion of the 2 ERs 275. FIG. 6 also includes 2 ERs, 276, at the input to the MZI modulator, which can be used to reduce/eliminate non-time varying reflections going back to either of the laser inputs.

Figure 7:
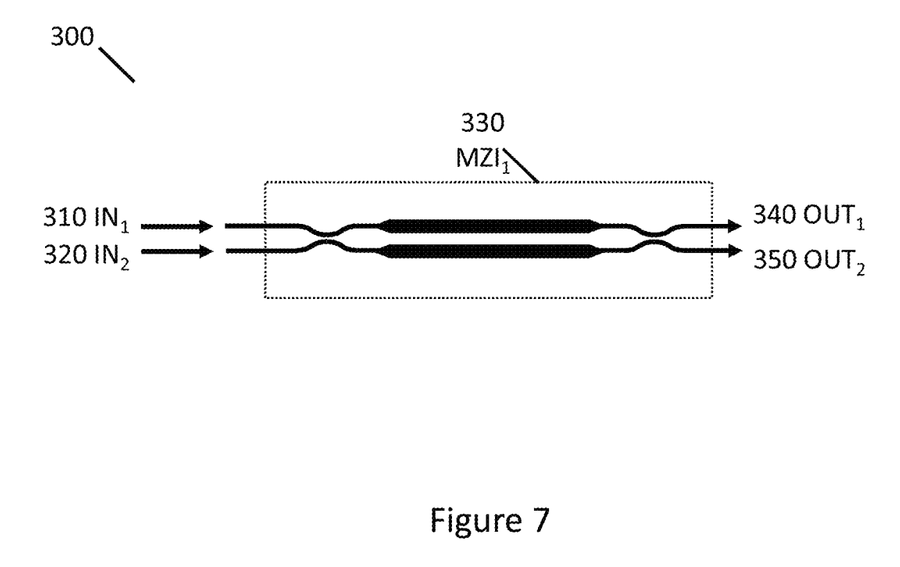
FIG. 7 shows a simplified schematic of an integrated MZI based modulator device with two inputs and two outputs (not showing internal details of the MZI modulator, reflections, etc.).
Figure 8:
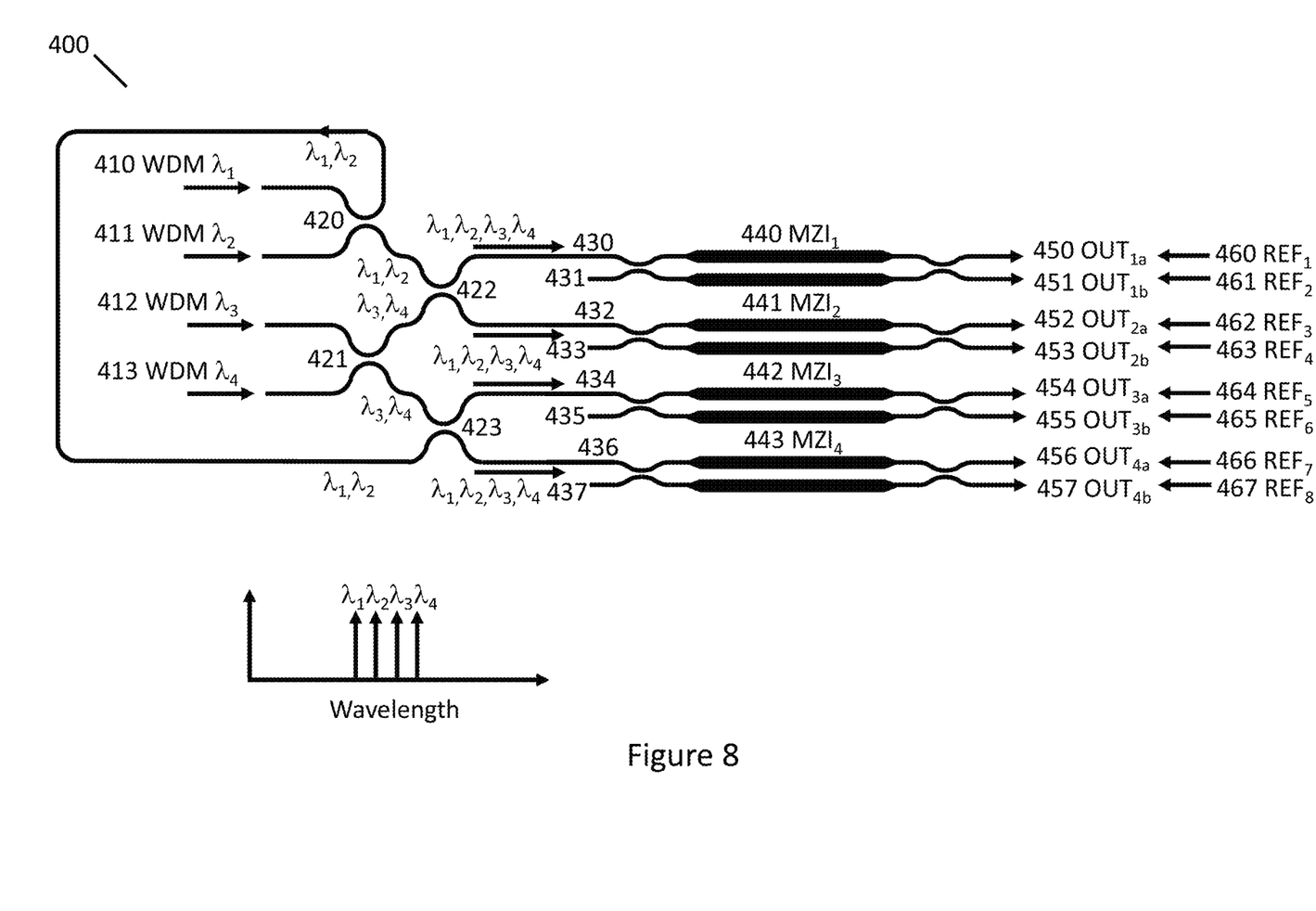
FIG. 8 shows a schematic of an RF Photonic Transmitter including a Geometric Optical Isolator using 4 WDM lasers and 4 MZI modulators.
Figure 9:
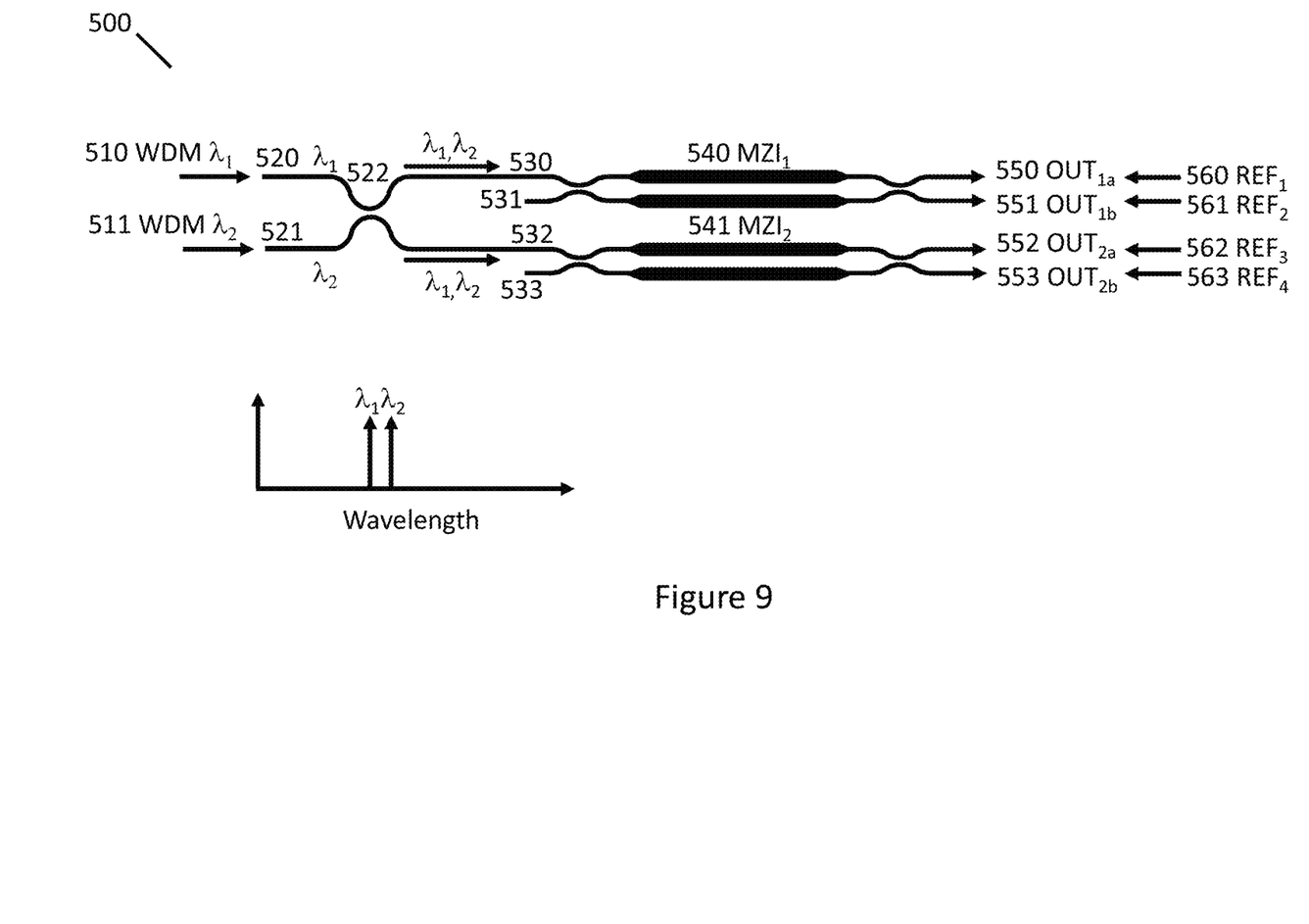
FIG. 9 shows a schematic of an RF Photonic Transmitter including a Geometric Optical Isolator using 2 WDM lasers and 2 MZI modulators.

FIG. 7 shows a simplified schematic of the integrated MZI modulator device shown in FIG. 6, in order to simplify the geometry of the WDM Geometric Optical Isolator shown in FIGS. 8 and 9. The integrated MZI modulator 330 includes two potential laser inputs 310 and 320, and two potential modulator outputs 340 and 350.

The 'WDM Geometric Optical Isolator' concept of the present invention utilizes multiple wavelength division multiplexed (WDM) lasers operating at different wavelengths, where the multiple wavelengths are very close to each other, e.g. 1 nm apart. The outputs of the lasers pass through a series of 2×2 couplers (typically directional couplers) which combine the multiple wavelengths together, such that after multiple sections of combining, there are a series of outputs each containing all of the laser wavelengths; however, the power level of each of the laser wavelengths within each output is significantly lower than the original laser power due to splitting/sharing of the multiple wavelengths.

As an example, consider the schematic in FIG. 8 in which there are 4 WDM lasers providing 4 wavelengths separated by, e.g. 1 nm. Assume each WDM laser has an output power of 100 mW (20 dBm). By using 2 stages of mixing/combining the of WDM laser outputs, through 2×2 (50%/50%) couplers, i.e. −3 dB directional couplers (e.g. with an excess loss of 0.5 dB per coupler), the 4 outputs (each marked '$\lambda_1, \lambda_2, \lambda_3, \lambda_4$') in FIG. 8 will include all 4 wavelengths, however the power of each wavelength will be only 13 dBm (20-7), while the total power (of all 4 wavelengths) will be 19 dBm, i.e. 1 dB power has been lost from the excess directional coupler losses.

These 4 wavelengths, each with 19 dBm of total optical power will pass into a modulator element, e.g. $MZI_1$ 440, the top MZI modulator in FIG. 8. Any reflection within the modulator element, or a reflection in the optical system after that modulator, will go back through the directional coupler network toward all 4 lasers. The power level of a reflection reaching any of the lasers is reduced by the power splitting ratio plus excess loss of the directional coupler network, i.e. 7 dB, multiplied by 2 for the two directions. In this case, the geometry of the directional coupler network provides optical isolation from reflections from any one modulator, or reflections that occur after that modulator, back to any one laser, of 14 dB. Each laser is only highly sensitive to reflections at its own lasing wavelength. These reflections coherently interact with light within the laser therefore increasing its noise. The lasers are not sensitive to reflections at different wavelengths, e.g., 1, 2, or 3 nm away from its lasing wavelength. The exemplary 14 dB reduction in reflections, as discussed above, is equivalent to a 14 dB optical isolator designed based on the concept of the present invention.

Increasing the number of lasers and wavelengths up to 8 will require another directional coupler stage in the directional coupler network, increasing the total isolation for an individual optical reflection back to an individual laser up to 21 dB. Adding more lasers, e.g. 16, can provide for even more optical isolation, 28 dB. This is a significant amount of optical isolation, which when utilized together with a laser design that is less sensitive to optical reflections, can allow the PIC to work with high-performance without the addition of actual integrated optical isolator elements (which are very difficult to fabricate and have poor performance). The WDM Geometric Optical Isolator of the present invention therefore enables the manufacture of PIC based high-power, high-SFDR analog optical links, without the need to include currently known optical isolator elements which are less than optimal.

The increased number of lasers included in the WDM Geometric Optical Isolator provides more overall optical power in the RF photonic link, which can improve the performance of the RF photonic link, e.g., its SFDR, NF, and Gain. In order to take advantage of the multiple optical outputs from the multiple modulators, an array of photodetectors in a traveling wave configuration can be used to combine all of the optical outputs. The current from each photodetector is combined to provide a single high current output. When a large number of optical outputs need to be combined into a single electrical output, with high speed, either a large number of single photodetectors or a large number of balanced pairs of photodetectors, the Group Array Photodetector Combiner (GAPC) or Balanced GAPC, as described in patent application Ser. No. 16/357,248, can achieve this, which then forms the receiving end of the RF photonic link.

A detail not considered in the previous paragraphs is the fact that although the optical reflections back to the 4 lasers are significantly smaller in size, due to the 2×2 coupler network, there will be a commensurate increase in the number of optical reflections. In the unlikely circumstance that all of these optical reflections were to add up coherently and exactly in phase when returning to a laser, then this approach would provide less isolation (i.e., the isolation would be reduced to the power splitting in the reverse direction only, thus only half of the isolation). However, this should not happen because (a) the reflections will likely have random relative phases, especially if from further on in the optical system, or (b) because the optical phase can be controlled within the PIC using Reflection Engineering (the first concept of this invention), and so the specific phases/timing of the different reflections internal to the PIC can be designed to destructively interfere back at the laser and provide even more optical isolation. This could therefore potentially provide even higher optical isolation due to the geometry of the optical directional coupler network with a geometry/phase reflection control on the PIC.

A distinction should be made between reflections within a PIC that are not time varying, i.e. are not modulated, e.g. by the phase modulation sections in an MZI modulator or the MZI modulator itself, and reflections that occur after such modulation, i.e. time varying reflections. The non-time varying reflections, such as internal to a CW source laser, or between the source laser and inside the modulator but before any modulating components, can be reduced/eliminated by including a single Engineered Reflection with the correct amplitude and phase, e.g. 276 in FIG. 6. Time varying reflections are more complicated, as the amplitude and phase of the reflection can vary with time; however, placing an Engineered Reflection physically close to the initial time varying reflection allows for that reflection to be reduced/eliminated.

In further detail, FIG. 8 shows an example of a WDM Geometric Optical Isolator 400, the second part of this invention. This example includes 4 wavelength specific, i.e. wavelength division multiplexed (WDM) lasers 410, 411, 412 and 413 operating at wavelengths $\lambda_1, \lambda_2, \lambda_3$ and $\lambda_4$, and 4 MZI modulators 440, 441, 442 and 443, providing 8 potential optical outputs 450, 451, 452, 453, 454, 455, 456, 457. The 4 wavelengths $\lambda_1, \lambda_2, \lambda_3$ and $\lambda_4$ are closely spaced, e.g. 1 nm apart, so that the 2×2 coupler/splitters and MZI modulators have the same effect on each of the 4 wavelengths, e.g. the MZI modulators are sufficiently broadband that at a specific bias point, e.g. quadrature bias, the modulator behaves effectively the same for all 4 wavelengths. Optical signals from WDM laser 410 and WDM laser 411 are combined in a 2×2 coupler 420, providing two outputs that include both wavelengths of the 2 WDM lasers, $\lambda_1$ and $\lambda_2$. Similarly, optical signals from WDM laser 412 and WDM laser 413 are combined in a 2×2 coupler 421, providing 2 outputs that include both wavelengths of the two WDM lasers, $\lambda_3$ and $\lambda_4$. These pairs of wavelengths are then combined with each other in a second set of 2×2 couplers, 422 and 423, providing 4 outputs each including all 4 wavelengths from the 4 WDM lasers, i.e. $\lambda_1, \lambda_2, \lambda_3$ and $\lambda_4$. The 4 outputs, that each include the 4 WDM wavelengths, provide the inputs to 4 MZI modulators 440, 441, 442 and 443, through input waveguides 430, 432, 434 and 436. The 8 outputs of the 4 MZI modulators, 450-457 go out into an external system. The pairs of outputs, one pair per MZI modulator, can pass along an optical system each to a balanced photodetector at the far end. Alternatively, a single output from each of the 4 MZI modulators can be used in an optical system, with a single photodetector for each at the far end of the system.

The multiple outputs from multiple MZI modulators, in this case 4, can be combined in a photodetector array at the far end of the system to provide a single high-performance RF output. For a large number of MZI modulator outputs, a device such as a Group Array Photodetector Combiner (GAPC) can be used to combine many high-speed RF photonic signals into a single electrical RF output, either a standard GAPC or a balanced GAPC device (as described in non-provisional patent application Ser. No. 16/357,248, which is incorporated fully herein). The WDM Geometric Optical Isolator concept shown in FIG. 8 provides effective optical isolation of reflections within the PIC and the following optical system back into the lasers 410, 411, 412 and 413. Additionally, the size of any optical reflections from within the PIC device returning back into the lasers, such as from transitions in the modulators or other devices within the PIC, can be reduced further by controlling the phase/timing of such reflections so that they are reduced or eliminated through destructive interference as they return to the lasers, using the Reflection Engineering approach. It is noted that the exemplary ERs shown in FIG. 6 are not specifically shown in FIG. 8, however their positions would be similar to those shown in FIG. 6, as transferred to FIG. 8.

The WDM Geometric Optical Isolator concept can provide effective optical isolation by using 2 or more WDM lasers arranged in a photonics circuit geometry, such as the version with 4 WDM lasers shown in FIG. 8, whereas a simpler example of this approach is shown in FIG. 9, with 2 WDM lasers and 2 MZI modulators. The more WDM lasers that are combined, the higher the effective optical isolation that is achieved.

FIG. 9 shows a WDM Geometric Optical Isolator 500 using only 2 WDM lasers. The 2 WDM lasers 510 and 511, coupled into waveguides 520 and 521, pass into a 2×2 coupler 522 which combines the 2 wavelengths and provides 2 outputs that include both wavelengths. These 2 dual wavelength signals pass into 2 MZI modulators 540 and 541, through input waveguides 530 and 532. The 4 outputs of the 2 modulators at the outputs of the device are 550, 551, 552 and 553. FIG. 9 shows optical reflections 560, 561, 562 and 563, which occur from reflections of the 4 optical outputs 550, 551, 552 and 553, from the output facet of the PIC and/or being reflected back from points further on in the optical system. The WDM Geometric Optical Isolator concept shown in FIG. 9 provides effective optical isolation of reflections within the PIC and following optical system back into the lasers 510 and 511. Additionally, the size of any optical reflections from within the PIC device returning back into the lasers, such as from transitions in the modulators or other devices within the PIC, can be reduced/eliminated by controlling the phase/timing of such reflections so that they are reduced or eliminated through destructive interference as they return to the lasers. It is noted that the exemplary ERs shown in FIG. 6 are not specifically shown in FIG. 9, however their positions would be similar to those shown in FIG. 6, as transferred to FIG. 9.

Although the drawings illustrate devices and systems with a limited number of optical lasers and modulators, the invention comprises other versions of similar devices with N WDM lasers and modulators, N≥2. Additionally, although a specific geometry is shown in the figures for combining and sharing the output power of multiple WDM lasers, alternative variations of the geometry providing the same combining/sharing to obtain effective optical isolation are within the scope of the invention.

Although the drawings and specification focus on MZI modulators, as these are prevalent in high-performance RF photonic links, the concepts described in the invention apply equally to other types of integrated modulators, e.g. phase modulators and electro-absorption modulators. Additionally, the design of optical reflections in order to provide destructive interference and minimize reflections back to the WDM lasers, applies to any integrated photonic components on a PIC that could provide optical reflections back to an integrated laser, not just couplers, modulators, waveguides and transitions.

Although several exemplary embodiments have been herein shown and described, those of skill in the art will recognize that many modifications and variations are possible without departing from the spirit and scope of the invention, and it is intended to measure the invention only by the appended claims.

The description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A transmitter, comprising:
   a photonic integrated circuit (PIC) comprising N WDM lasers and N modulators integrated on a common solid substrate, wherein N≥2, said WDM lasers and said modulators being interconnected via waveguides and a series of one or more combiner/splitter elements, each combiner/splitter element comprising at least one coupler;
   said common solid substrate controlling an optical phase within said PIC and within said WDM lasers, said modulators, said waveguides, and said series of one or more combiner/splitter elements;
   said waveguides and said series of one or more combiner/splitter elements forming a structure, said structure combining wavelengths from said N WDM lasers into N output waveguides, each of said N output waveguides comprising signals from all of said N WDM lasers, an optical power of each wavelength in each of said N output waveguides being reduced by a splitting factor, said splitting factor being determined by an amount of combiner/splitter elements and an amount of said WDM lasers, the N output waveguides providing inputs to the N modulators;
   wherein a power level of any inherent optical reflections occurring within said N modulators, or within said PIC optical circuit following said N modulators, returning through said series of one or more combiner/splitter elements is reduced by said splitting factor via said at least one coupler of said one or more combiner/splitter elements, plus excess loss due to said at least one coupler of said one or more combiner/splitter elements, thereby reducing a total optical reflection power returning to any one of said N WDM lasers.

2. The transmitter according to claim 1, further comprising:
   at least one engineered optical reflection point, said at least one engineered optical reflection point forming an optical reflection relative to predetermined inherent optical reflections in the PIC, wherein said inherent reflections and said engineered optical reflection points within the PIC combine interferometrically thereby lowering the total optical reflection power returning to any one of said couplers and in turn to each one of the N WDM lasers.

3. The transmitter according to claim 1, wherein at least one of said N modulators comprises a corresponding pair of engineered optical reflection points in parallel arms, said pair of engineered optical reflection points in parallel arms being 180 degrees out of phase.

4. The transmitter according to claim 1, wherein each of said N WDM lasers is a semiconductor-based distributed feedback (DFB) laser.

5. The transmitter according to claim 1, wherein each of said N WDM lasers is a semiconductor-based distributed Bragg reflector (DBR) laser.

6. The transmitter according to claim 1, wherein each of said N WDM lasers is a wavelength tunable laser.

7. The transmitter according to claim 1, further comprising an electro-absorption modulator.

8. The transmitter according to claim 1, wherein the common solid substrate comprises silicon.

9. The transmitter according to claim 1, wherein the common solid substrate comprises indium phosphide.

10. The transmitter according to claim 1, wherein the common solid substrate comprises gallium arsenide.

11. The transmitter according to claim 1, wherein each one of said N WDM lasers emits at a wavelength at least 1 nm apart from all other ones of said N WDM lasers.

12. The transmitter according to claim 1, wherein said coupler is a 2×2 coupler.

13. The transmitter according to claim 1, wherein said coupler is a directional coupler.

14. The transmitter according to claim 1, wherein said series of one or more combiner/splitter elements comprises at least one pair of 2×2 directional couplers.

15. The transmitter according to claim 1, wherein said series of one or more combiner/splitter elements comprises at least two pairs of 2×2 directional couplers.

\* \* \* \* \*

UNITED STATES PATENT AND TRADEMARK OFFICE
CERTIFICATE OF CORRECTION

PATENT NO. : 10,855,376 B1
APPLICATION NO. : 16/777131
DATED : December 1, 2020
INVENTOR(S) : Paul A. Morton and Jacob Khurgin It is certified that error appears in the above-identified patent and that said Letters Patent is hereby corrected as shown below:

In the Specification

Column 1, Lines 8-13 Please correct the cross-reference section as follows:
This patent application is a divisional application of the U.S. application Ser. No. 16/393,842, filed on Apr. 24, 2019 which claims priority to the U.S. Provisional Patent Application Ser. No. 62/662,537, titled "Transmitter including WDM Geometric Optical Isolator", filed on Apr. 25, 2018, all of which are fully incorporated herein by reference.

Signed and Sealed this
Second Day of January, 2024

Katherine Kelly Vidal
*Director of the United States Patent and Trademark Office*